US009871375B2

(12) United States Patent
Pavageau

(10) Patent No.: US 9,871,375 B2
(45) Date of Patent: Jan. 16, 2018

(54) SECURE BODY OF MEMORY CARD READER

(71) Applicant: Compagnie Industrielle et Financiere d'Ingenierie "Ingenico", Paris (FR)

(72) Inventor: Stephane Pavageau, La Roche de Glun (FR)

(73) Assignee: INGENICO GROUP, Paris (FR)

( * ) Notice: Subject to any disclaimer, the term of this patent is extended or adjusted under 35 U.S.C. 154(b) by 321 days.

(21) Appl. No.: 14/439,980

(22) PCT Filed: Oct. 28, 2013

(86) PCT No.: PCT/EP2013/072528
§ 371 (c)(1),
(2) Date: Apr. 30, 2015

(87) PCT Pub. No.: WO2014/067905
PCT Pub. Date: May 8, 2014

(65) Prior Publication Data
US 2015/0295400 A1     Oct. 15, 2015

(30) Foreign Application Priority Data
Oct. 30, 2012   (FR) .................................. 12 60357

(51) Int. Cl.
*H02H 9/00* (2006.01)
*H02H 9/04* (2006.01)
*G06K 7/00* (2006.01)
*H05K 5/00* (2006.01)
*H05K 5/02* (2006.01)

(52) U.S. Cl.
CPC .......... *H02H 9/045* (2013.01); *G06K 7/0056* (2013.01); *G06K 7/0091* (2013.01); *H05K 5/0091* (2013.01); *H05K 5/0247* (2013.01)

(58) Field of Classification Search
CPC ....................................................... H02H 9/045
USPC ........................................................... 361/56
See application file for complete search history.

(56) References Cited

U.S. PATENT DOCUMENTS 5,841,620 A * 11/1998 Masghati ............... H02H 9/044
                                                               361/111
7,508,644 B2 * 3/2009 Cheung .................. H01T 21/00
                                                               361/111

(Continued)

FOREIGN PATENT DOCUMENTS

FR   2793921 A1   11/2000
GB   2411756 A    9/2005

OTHER PUBLICATIONS

English Translation of the International Search Report dated Feb. 5, 2014, for International Application No. PCT/EP2013/072528 filed Oct. 28, 2013.

(Continued)

*Primary Examiner* — Stephen W Jackson
(74) *Attorney, Agent, or Firm* — David D. Brush; Westman, Champlin & Koehler, P.A.

(57) ABSTRACT

A body of a memory card reader, which has an overall rectangular parallelepiped shape including a slot for inserting a memory card. The reader body includes, on a rear surface thereof, a recess for receiving a memory card connector, the receiving recess being of a predetermined volume shape and including at least one conductive track.

10 Claims, 3 Drawing Sheets

(56) References Cited

Figure 1:
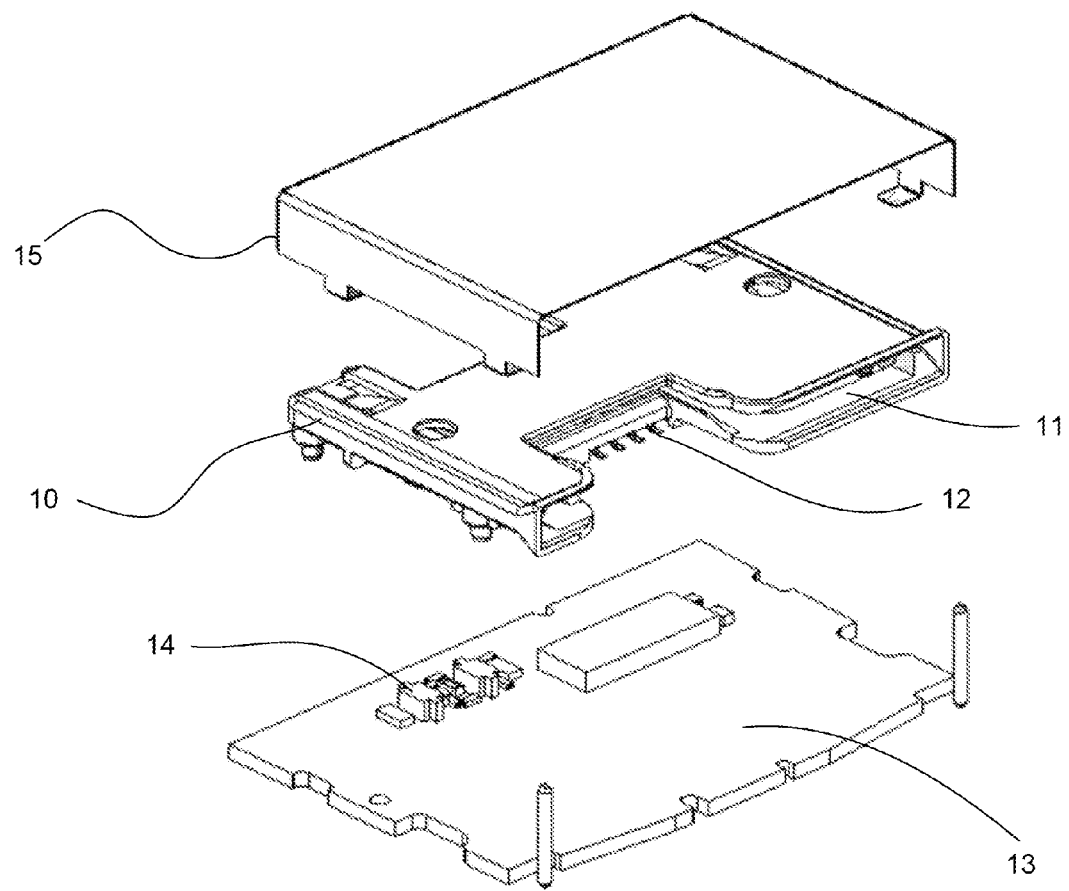

U.S. PATENT DOCUMENTS 9,530,029 B2 * 12/2016 Jadeau ................. H05K 1/0275
2002/0088857 A1 7/2002 Bricaud et al.

OTHER PUBLICATIONS

English Translation of the International Report on Patentability dated May 28, 2014, for International Application No. PCT/EP2013/072528 filed Oct. 28, 2013.
French Search Report dated Jul. 29, 2013 for corresponding French Application No. 1260357, filed Oct. 30, 2012.

* cited by examiner

SECURE BODY OF MEMORY CARD READER

CROSS-REFERENCE TO RELATED APPLICATIONS

This Application is a Section 371 National Stage Application of International Application No. PCT/EP2013/072528, filed Oct. 28, 2013, the content of which is incorporated herein by reference in its entirety, and published as WO 2014/067905 on May 8, 2014, not in English.

1. FIELD OF THE INVENTION

The invention is situated in the field of memory card readers. An object of the invention more particularly is a memory card reader to be inserted into a memory card reader terminal. Such a terminal can be a payment terminal or an identification terminal. More generally, the invention relates to any type of terminal that can include a memory card reader.

2. PRIOR ART

Memory card reader terminals comprise, in addition to a memory card reader, a certain number of components such as a keypad, a screen, one or more processors, memory, an electrical power source. For several years now, memory card reader terminals have seen an increase in their functions. This is especially true for payment terminals. In addition to payment function, the terminals have embedded functions for carrying out network communications, detecting contactless memory cards, managing coupons (for example loyalty coupons), etc.

In addition to the increase in such auxiliary functions, memory card reader terminals must also be resistant to various attacks or attempts at fraud to which they are frequently subjected. In order to obtain homogeneous resistance by terminals to attacks, international standards have been laid down. In the field of payment for example, the PCI PED (or Payment Card Industry—Pin Entry Device) standard has laid down requirements in terms of intrusion and detection of attempts to attack terminals. This is not the only standard in force.

However, because of these standards, terminals which previously had low-level protection have gradually been replaced by increasingly secured terminals. Among the different aspects of securing terminals, industrialists in the sector are concerned more particularly with obtaining protection for memory card readers. The memory card reader indeed remains a weak link in the memory card reader terminal. This is because the memory card reader includes a slot for inserting the memory card, and this slot makes the interior of the terminal accessible from the exterior. More particularly, attackers seek to obtain access to the memory card connector. The memory card connector is the part of the memory card reader that comes into contact with the chip or the microprocessor embedded in the memory card. When an attacker or hacker succeeds in obtaining access to this memory card connector without being spotted by anybody, then it becomes possible to intercept and read the data exchanged between the chip or the microprocessor of the card and the processor of the memory card reading terminal Among the pieces of data intercepted, we may cite especially the secret code entered by the client when the secret code is requested. This code can then be conveyed without encryption to certain smart cards.

This explains why much effort has been made to secure memory card readers. Thus, for example, memory card readers have been provided with a protection with lattice. This protection prevents an introduction into the terminal by drilling. When an object seeks to penetrate the protective enclosure, a short circuit is produced, causing the terminal to then be put out of service.

Besides, modifications aimed at protecting the memory card containers against electrostatic discharges and against wear and tear have also been proposed. For example, metal parts are disposed at the inlet of the memory card reader. These metal parts provide for mechanical guidance (prevention against wear and tear) and/or the discharging of the card prior to its insertion into the memory card reader. These metal parts commonly have the shape of metal guiding rods with a height of a few millimeters. Another example consists in adding metal parts that take the form of a card discharging comb.

All these modifications have led to great complexity of manufacture. Besides, the cost of manufacture has also increased. At present, the requirements of the standards in terms of security are such that it is necessary, in order to manufacture a reading terminal, it is necessary to plan for numerous steps. These numerous steps bring together, all at once, staggered welding of components, the need to have components resistant to reflow soldering, etc. In addition to the complexities of manufacture of the memory card reader terminal, these methods make the maintenance of the terminals produced highly complex or even impossible, thus giving rise to difficulties for maintenance service providers as well as for the manufacturers of the memory card reader terminal.

Referring to FIG. 1, we present a classic assembly of a memory card reader. This memory card reader comprises a memory card reader body 10 comprising a memory card insertion slot 11. The memory card connector is directly integrated into the memory card reader. It comprises pins 12 for connection to the printed circuit board (PCB) 13 (seen in a partial view). The PCB 13 also has electronic components 14. To protect the memory card reader 10, it is covered with a full protective coating 15 as well as a front protective coating 15b.

There is therefore a need for providing a memory card reading architecture that is intrinsically secured and does not require complementary protection.

3. SUMMARY OF THE INVENTION

The invention thus relates to a memory card reader body.

More particularly, the invention relates to a memory card reader body with an overall rectangular parallelepiped shape comprising a slot for inserting a memory card.

According to the invention, such a reader body comprises, on a rear face 21, a housing for receiving a memory card connector, said housing for receiving having a predetermined volume shape and comprising at least one conductive track.

Thus, the invention facilitates the assembly. Indeed, owing to the configuration of the memory card reader body, the invention makes it possible first of all to weld the memory card connector to the PCB and then to fix the body of the memory card reader to the PCB in covering the memory card connector. In a complementary way, this memory card reader architecture also makes it possible to fix other components to the PCB, the body of the memory card reader subsequently covering also the other components. In addition, since the housing for receiving comprises a device for protecting said memory card connector, it becomes extremely difficult to penetrate the device in proximity to the memory card connector. The rear face of the body of the reader is the one intended to cover the memory card connector when the unit is mounted on a destination PCB.

According to one particular characteristic, said volume shape of said housing for receiving is substantially equal to the volume shape of the memory card connector.

Thus, the invention limits the volume left free between the housing of the body of the memory card reader and the memory card connector. More particularly, the volume left free corresponds to the volume needed for the passage of the memory card.

According to one particular characteristic, said rear face of said memory card reader body furthermore comprises at least one complementary housing to receive at least one electronic component.

Thus, the invention also provides for a protection of one or more complementary electronic components that are covered by the memory card reader when it is fixed to the PCB.

According to one particular characteristic, in said housing for receiving, said memory card reader body comprises at least one protective circuit.

According to the invention, such a body of the memory card reader comprises, on the rear face of the body of the reader, also called an internal face, at least one protective track, this track covering at least one surface appreciably equivalent to a volume of a free space in said memory card reader body.

Thus, according to the invention, it is no longer necessary to have available a protective flexible piece over the body of the memory card reader. Indeed, according to the invention, the body of the reader of the memory card directly integrates the track or tracks that fulfill the same function as the protective flexible piece and the front protection. In addition, since it is no longer necessary to have the protective elements of the prior art, the invention simplifies the mounting of the reader terminal since it eliminates several mounting steps and also eliminates the cost of these protections.

According to one particular embodiment, said protective circuit takes the form of at least one lattice comprising said at least one conductive track.

According to one particular embodiment, said protective circuit takes the form of at least one continuous electrical track comprising said at least one conductive track.

For example, this track can be obtained by the use of the technique known as the molded interconnected device (MID) technique or by other methods.

According to one particular embodiment, said protective circuit is made by means of a laser etching technique.

This laser etching technique is coupled with chemical baths and is called laser direct structuring or LDS.

According to one particular characteristic, said protective circuit is a flexible printed circuit positioned within said housing for receiving.

According to one particular characteristic, said rear face of said memory card reader comprises at least one complementary housing for receiving at least one electronic component and said complementary housing is positioned beneath said protective circuit.

According to one particular characteristic, said at least one conductive track is shaped to define electrostatic discharge zones coming into contact with a smart card when said smart card is introduced into said reader body.

The invention also relates to a memory card reader terminal. According to the invention, such a terminal comprises a body of the memory card reader as described here above.

4. FIGURES

Figure 2:
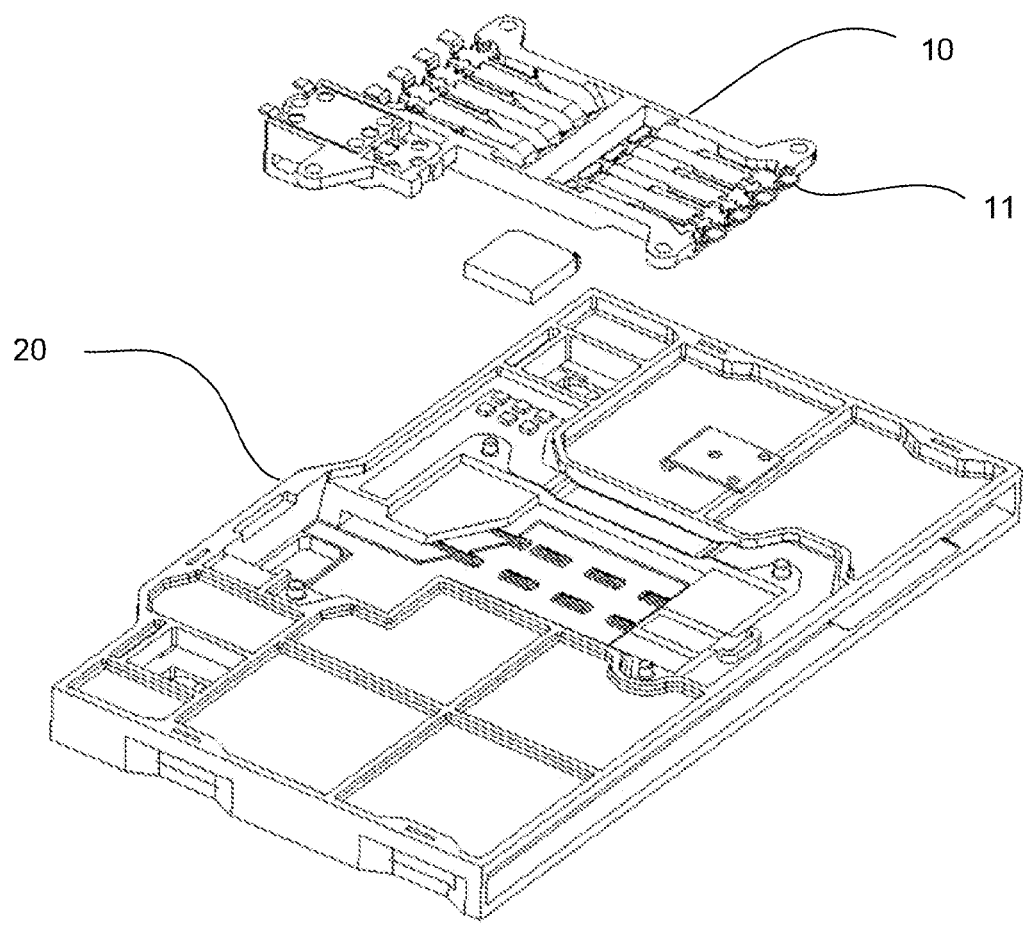
Figure 3:
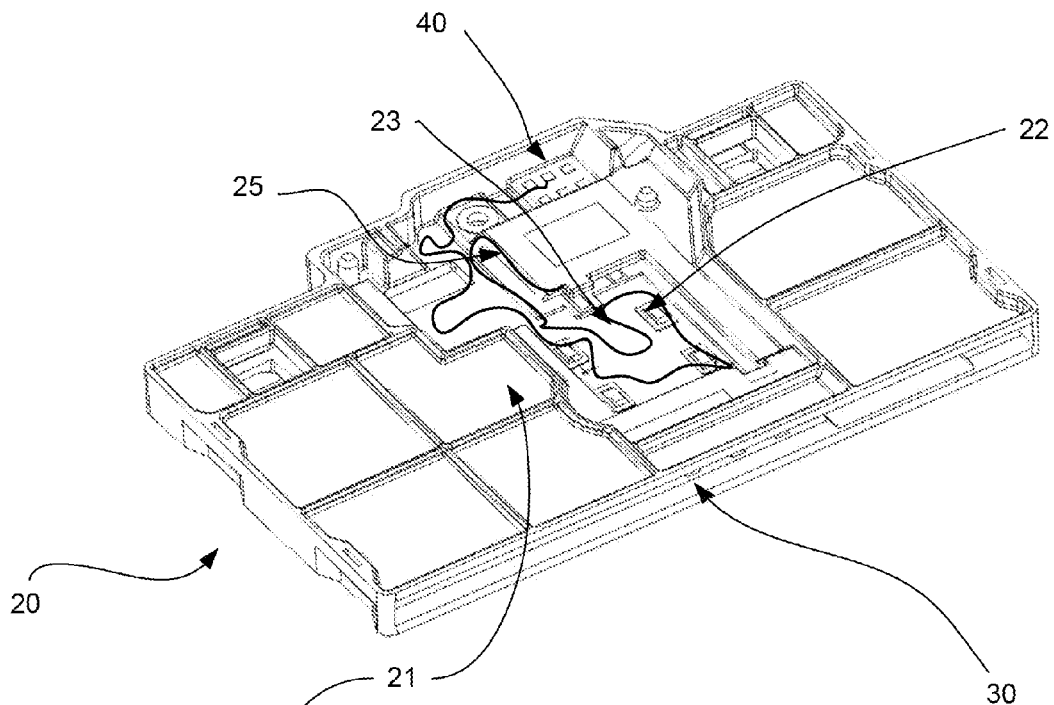
Figure 4:
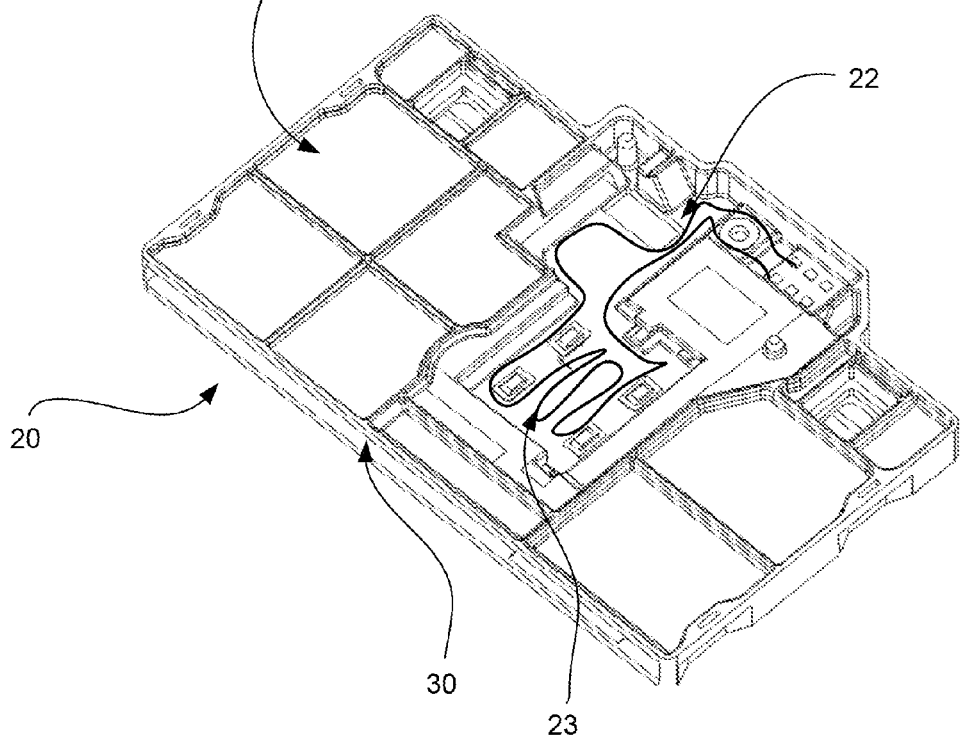

Other features and advantages of the invention shall appear more clearly from the following description of one preferred embodiment, given by way of a simple, illustrative and non-exhaustive example, and from the appended drawings, of which:

FIG. 1, already presented, describes the classic architecture of a memory card reader, FIG. 2 illustrates the general principle of the invention, namely the separation of the memory card connector and of the memory card reader body into two distinct functional units;

FIGS. 3 and 4 illustrate one embodiment of the invention in which the body of the memory card reader comprises an intrusion detection track;

5. DETAILED DESCRIPTION

5.1. Reminder of the Principle of the Invention

The general principle of the invention consists in proposing an architecture of a memory card reader that directly integrates the functional constraints inherent in the working of this type of device. More particularly, the general principle of the invention consists in the subdivision of the memory card reader into two distinct parts. There is a first part through which the memory card signals travel in transit, this part including the switch for detecting the presence of a card. This first part is capable of ensuring a residual portion of the electrostatic discharge (from the memory card connector). There is then a second part enabling the insertion of the memory card. This second part ensures firstly the guidance of the memory card and the absorption of the memory card forces. Secondly it carries out a part of the electrostatic discharging of the card. This second part also ensures protection of the signals exchanged between the memory card and the memory card connector (this is the body of the memory card reader proper).

The general principle of the invention is described with reference to FIG. 2. According to the invention, a memory card connector 10 is built independently of the memory card reader body 20. The memory card connector 10 is designed to enable a reading of the signals coming from the memory card (not shown). In FIG. 1, the memory card connector 10 is designed for the reading of a smart card. To this end, the memory card connector 10 comprises a certain number of pins 11 (eight in FIG. 2) used to come into contact with corresponding zones of the memory card (six or eight zones depending on the memory card). The pins 11 are generally metal spring blades positioned on the surface of the chip. Since the object of the disclosure is not this connector, it shall not be described in detail here below.

According to the invention, on the contrary, this memory smart card 10 is independent of the memory card reader body 20. This means that, unlike in the prior-art systems, the memory card connector 10 is not assembled with the body of the memory card reader 20 before being assembled with the PCB of the reader terminal. The invention proposes firstly to fix the memory card connector 10 to the PCB and then to fix the body of the memory card reader 20 over the connector 10. In other words, it will be understood that this assembly is not at all of the same nature as the assembly of the prior art since the memory card connector is covered by the body of the memory card reader which, so to speak, protects it. In other fields, there are known terminals in which the lower cover of the terminal (i.e. its external casing) acts as the reader body. However, unlike in the invention, this cover is not protected and is not used to carry out a securing procedure. This reader body has no track and does not fulfill the functions described here. More particularly, this reader body has no track whether on its rear face to protect the terminal or in any other portion of the reader in order for example to carry out an electrostatic discharge of the memory card prior to its insertion.

Additionally, in at least one embodiment, the invention proposes to eliminate the protective flexible piece which entirely covers the memory card reader. In one embodiment, the invention replaces this protective flexible piece by an internal protective device, i.e. one that is situated inside the memory card reader body 20 itself.

Here below, one specific embodiment of the invention is described. It is understood that this embodiment in no way restricts the scope of the invention. More particularly, in other embodiments of the invention, the memory card connector can be protected by using means for etching electrical tracks other than those described here below (for example a flexible circuit bonded to the interior of the body of the reader).

5.2. Detailed Description of One Embodiment

In this embodiment, an internal protective device is positioned in the body of the memory card reader. In this embodiment, the protective device takes the form of electrical tracks integrated into the body of the memory card reader 20 in proximity to the contact zones of the pins of the memory card connector 10 when the body of the memory card reader covers the memory card connector.

This embodiment is presented more particularly with reference to FIGS. 2 and 3. As indicated here above, a complementary part (the body of the memory card reader 20) is added above the memory card connector. In this embodiment of the invention, the body of the memory card reader 20 is a part made of plastic. In addition to its functions of insertion and holding and of absorbing the stresses in the memory card, for example the smart card, the body of the memory card reader 20 also protects the I/O signal travelling in transit through the memory card (smart card) and the memory card connector 10, as closely as possible to the signal to be protected (the structured surface is therefore smaller and the protection is better than with a flexible shielding external to the memory card reader).

In this embodiment, the body of the memory card reader 20 is a part with a generally rectangular parallelepiped shape, a width of about 60 millimeters, a depth of about 40 millimeters, and a height of about 4 millimeters. The body of the memory card reader 20 comprises an insertion slot 30, with a height of 0.8 to 1.5 millimeters. The insertion slot 30 enables the insertion of the memory card in an accurate position so that it comes into contact with the memory card connector 10. The memory card reader also has, on its rear face 20, a housing 22 intended to receive and cover the memory card connector 10. The volume shape of this housing for receiving 22 is appreciably complementary to the volume shape of the memory card connector 10, without counting the space needed for the presence of the memory card. Thus, the memory card connector 10 and more specifically the tracks through which the I/O signals travel are covered by the body of the memory card reader 20. In addition, in the housing 22, the body of the memory card reader comprises at least one protective circuit 23. This protective circuit 23 can be a 3D circuit. This protective circuit 23 for example takes the form of one or more intrusion detection lattices or the form of one or more continuous intrusion detection tracks (for example a ground circuit, and two lattices at different potentials). This protective circuit 23 is positioned in the housing 22 on the rear face of the memory card. It is also positioned on the side edges 24 of the housing. Besides, the protective circuit is stepped: it means that the protective circuit 23 is not situated in a single plane but in several (at least two) planes. Thus, it is ensured that the protective circuit 23 appreciably covers the volume shape of the memory card connector 10. In this embodiment, the memory card reader body 20 furthermore comprises at least one complementary housing 40 for receiving at least one electronic component.

More particularly, the body of the memory card reader, in one particular embodiment of the invention, is a part called an MID (molded interconnect device). More particularly, the body of the memory card reader MID protects two surfaces in opposite parts. Indeed, a laser etching is done in order to produce 3D electronic tracks. The use of this technique is unusual in the field of the invention.

In one embodiment, the part made by LDS (laser direct structuring) has an internal surface which is extended to an upper part (reference 24 in FIGS. 2 and 3) enabling complete protection in MID, in every direction. In this embodiment of the invention, the MID etching enables the making of one or more lattices, said lattice or lattices being classically a protection enabling the detection of the insertion of a device into the body of the memory card reader. The use of a lattice to detect an insertion or an attempt at drilling is a technique known in the field of the invention. However, unlike in the prior art, the invention directly integrates the lattice into the internal surface of the memory card connector and does so in a highly integrated manner.

In other words, the laser etching is done in three dimensions in order to be in keeping with a volume of the memory card connector and more particularly to be situated in proximity to the sending/reception of signals coming from the card. Thus, a 3D lattice is defined. This 3D lattice is adapted to the shape of the memory card connector. There is no longer an excessively sized flexible piece or another element for the front protection given the zone to be protected.

More particularly, the distance between the etching defining the protective tracks and the pins of the memory card connector is about one-tenth of a millimeter.

It will therefore be understood that, with this magnitude of size, it is appreciably more complicated to make an attack on the memory card connector in trying to insert a device. Thus, in only one part, the invention makes it possible to bring down the protection to the lower part of the connector (the recessed or undercut portion) in adding neither a complementary phase nor an intermediate connection.

The body of the reader also resolves the problems related to the stopping the card upon insertion. It does not require that the card should be stopped by the electrical connector which for its part carries only the fastenings to the electronic printed circuit, which are soldered by reflow soldering (and therefore are fairly fragile with respect to the stresses generally observed).

It must also be noted that the body of the reader can be formed of two parts that can be clipped together with a link between the two parts which can overlap each other, and that there is no possibility of subsequent separation (except by damaging the lattice and therefore activating a protective response). In this case, the lattice or lattices can also be bigger because it is no longer necessary for them to be visible, for reasons of manufacturing process.

5.3. Complementary Characteristics

In certain embodiments, which may or may not be combined with the characteristics described here above, the body of the memory card reader as defined comprises a discharge zone (called an ESD zone) enabling a first discharging of the memory card when it is inserted into the reader. More particularly, in order to preserve the property whereby the body of the memory card connector is a single piece, this electrostatic discharge zone is produced by using MID technology. In a first embodiment, this discharge zone is situated in proximity to the zone of insertion of the memory card, appreciably at the position where the chip of the memory card is situated during the insertion. More particularly, the body of the reader is configured so that the chip of the card comes into contact with this discharge zone.

In this second embodiment, this discharging zone is situated within the body of the reader, more particularly on the internal face of the flanks of the body of the reader. More particularly, the internal face of the flanks of the body of the reader is configured so that at least one edge of the card comes into contact with this discharging zone.

According to another characteristic, in order to avoid the problems related to the welding of the protective lattice (on the inner face of the body of the memory card connector) to the PCB, the connection between these two elements is done by means of an elastomeric connector, for example of the Zebra (registered mark) type. Thus, it is not necessary to available complicated mechanisms for welding the body of the memory card reader to the PCB: indeed, since the connection is provided by means of an elastomeric connector, the mounting of the unit formed by the memory card connector, the elastomeric connector and the body of the memory card reader is facilitated.

More generally, to facilitate the assembly, the following steps are implemented:
a step for fastening the memory card connector to the PCB. This fastening can be done by screwing in or by soldering or by bonding or by a combination of these methods. Other fastening methods can also be used.
a step for positioning the elastomeric connector (when it is used). The positioning of the elastomeric connector can advantageously be done in a zone left free for this purpose within the memory card connector.
a step for positioning and fastening the body of the memory card reader with a mode of fastening of the body of the reader relatively to the PCB. In the case of Zebra, a screw fixed to a part of the memory card connector is an advantageous solution or again the addition of a fifth pin acting as a mechanical holding piece.

Thus, two or three steps only are needed to assemble and fix the memory card reader to the PCB.

5.4. Description of One Embodiment of a Memory Card Reader

This embodiment is more particularly described with reference to FIG. 4. For greater simplicity, the numerical references that have been previously used in FIGS. 2 and 3 are kept. In this embodiment, the memory card reader comprises a memory card reader body 20, a memory card connector 10, and an elastomeric connector 30. The architecture of the memory card connector 10 is built so that it comprises a space ECE left free for the positioning of the elastomeric connector 30. Thus, during the assembling, the memory card connector 10 is first of all fixed to the PCB and then the elastomeric connector 30 is inserted into the space ECE. The body of the memory card reader 20 is then positioned above the unit formed by the memory card connector and the elastomeric connector. As already mentioned, the body of the memory card connector 20 comprises a zone for discharging the card 24. The memory card reader 20 is fixed to the PCB by means of a screw 26 and four anchoring slugs 27. The screw 26 also serves to maintain permanent pressure over time. The screw 26 is screwed into the memory card connector which is itself fixed to the PCB by soldering. The link is therefore direct. The anchoring slugs have a particular shape adapted on the one hand to fulfilling a function of guiding the memory card in the reader and, on the other hand, if necessary, to carry out an electrostatic discharging of the edges of the inserted card.

In addition, in this system, the centering between the memory card connector and the body of the memory card reader enable the positioning to be done in a rigorous way.

Indeed, in this embodiment, the memory card connector comprises at least two centering holes. The centering holes are configured so that the centering pins which are integrated into the body of the memory card reader can take position in the centering holes. Thus, in this embodiment, it is not possible to carry out an erroneous mounting of the memory card reader. More particularly, it is not possible to position the body of the memory card reader with an incorrect angle relative to the connector.

The invention claimed is:
1. A memory card reader body comprising:
an overall rectangular parallelepiped shape comprising a slot for inserting a memory card;
a rear face;
a housing on the rear face for receiving a memory card connector, said housing having a predetermined volume shape, wherein said volume shape of said housing is substantially equal to a volume shape of the memory card connector; and
at least one protective conductive track on the rear face of the reader body and in proximity to a contact zone of pins of the memory card connector, said at least one track covering at least one surface appreciably equivalent to a volume of a free space of said memory card reader body.

2. The memory card reader body according to claim 1, wherein said rear face of said memory card reader body furthermore comprises at least one complementary housing to receive at least one electronic component.

3. The memory card reader body according to claim 1, wherein, in said housing for receiving, said memory card reader body comprises at least one protective circuit.

4. The memory card reader body according to claim 3, wherein said protective circuit takes the form of at least one lattice comprising said at least one conductive track.

5. The memory card reader body according to claim 3, wherein said protective circuit takes the form of at least one continuous electrical track comprising said at least one conductive track.

6. The memory card reader body according to claim 3, wherein said protective circuit is made by means of a laser etching technique.

7. The memory card reader body according to claim 3, wherein said protective circuit is a flexible printed circuit positioned within said housing for receiving.

8. The memory card reader body according to claim 3, wherein said rear face of said memory card reader comprises at least one complementary housing for receiving at least one electronic component and said complementary housing is positioned beneath said protective circuit.

9. The memory card reader body according to claim 1, wherein said at least one conductive track is shaped to define electrostatic discharge zones coming into contact with a smart card when said smart card is introduced into said reader body.

10. A memory card reader terminal comprising:
- a memory card reader body, which comprises:
  - an overall rectangular parallelepiped shape comprising a slot (30) for inserting a memory card;
  - a rear face;
  - a housing on the rear face for receiving a memory card connector, said housing having a predetermined volume shape, wherein said volume shape of said housing is substantially equal to a volume shape of the memory card connector; and
  - at least one protective conductive track on the rear face of the reader body and in proximity to a contact zone of pins of the memory card connector, said at least one track covering at least one surface appreciably equivalent to a volume of a free space of said memory card reader body.

\* \* \* \* \*